US006620573B2

(12) United States Patent
Van Damme et al.

(10) Patent No.: US 6,620,573 B2
(45) Date of Patent: Sep. 16, 2003

(54) PROCESSLESS LITHOGRAPHIC PRINTING PLATE

(75) Inventors: Marc Van Damme, Mechelen (BE); Wim Sap, Bruges (BE)

(73) Assignee: Agfa-Gavaert (BE)

( * ) Notice: Subject to any disclaimer, the term of this patent is extended or adjusted under 35 U.S.C. 154(b) by 0 days.

(21) Appl. No.: 09/993,073

(22) Filed: Nov. 19, 2001

(65) Prior Publication Data

US 2002/0132187 A1 Sep. 19, 2002

Related U.S. Application Data

(60) Provisional application No. 60/257,111, filed on Dec. 21, 2000.

(30) Foreign Application Priority Data

Nov. 21, 2000 (EP) .......................................... 00204092

(51) Int. Cl.[7] .............................................. G03F 7/038

(52) U.S. Cl. ............................... 430/270.1; 430/271.1; 430/272.1; 430/273.1; 430/302; 430/348; 430/944; 430/945; 430/278.1; 101/453; 101/454; 101/455; 101/463.1; 101/467

(58) Field of Search .......................... 430/270.1, 271.1, 430/273.1, 302, 272.1, 303, 278.1, 348, 944, 945, 964; 101/453, 454, 455, 460, 463.1, 465, 466, 467

(56) References Cited

U.S. PATENT DOCUMENTS

| | | | | | |
|---|---|---|---|---|---|
| 5,466,653 | A | * | 11/1995 | Ma et al. | 503/200 |
| 5,738,013 | A | * | 4/1998 | Kellett | 101/463.1 |
| 5,958,563 | A | * | 9/1999 | Harwood et al. | 101/458 |
| 5,962,188 | A | * | 10/1999 | DeBoer et al. | 430/273.1 |
| 5,985,515 | A | * | 11/1999 | Van Rompuy et al. | 430/272.1 |
| 6,090,524 | A | * | 7/2000 | Deboer et al. | 430/272.1 |
| 6,110,645 | A | * | 8/2000 | DeBoer et al. | 430/302 |
| 6,196,129 | B1 | * | 3/2001 | Kellett | 101/467 |
| 6,284,433 | B1 | * | 9/2001 | Ichikawa et al. | 430/303 |
| 6,367,383 | B1 | * | 4/2002 | Leenders et al. | 101/465 |
| 6,374,737 | B1 | * | 4/2002 | Bennett et al. | 101/457 |
| 6,399,276 | B1 | * | 6/2002 | Van Damme et al. | 430/273.1 |
| 2001/0007464 | A1 | * | 7/2001 | Kellett | 347/96 |
| 2002/0068239 | A1 | * | 6/2002 | Van Damme et al. | 430/273.1 |

FOREIGN PATENT DOCUMENTS

EP 0 967 077 A1 12/1999

OTHER PUBLICATIONS

Polymers—A Property Database [online], Copyright CRC Press, LLC, 2000, [retrieved May 15, 2003]. Retrieved from the internet <URL: http://www.knovel.com/knovel2/Toc.jsp?SpaceID=10067&BookID=51#node11782274>.*

* cited by examiner

*Primary Examiner*—Janet Baxter
*Assistant Examiner*—Barbara Gilliam
(74) *Attorney, Agent, or Firm*—Leydig, Voit & Mayer, Ltd.

(57) ABSTRACT

A negative-working heat-sensitive material for making a lithographic printing plate by direct-to-plate recording is disclosed which comprises in the order given a lithographic base having a hydrophilic surface, an oleophilic imaging layer and a cross-linked hydrophilic upper layer, characterize in that the oleophilic imaging layer comprises at least one transition metal complex of an organic acid. Materials according to the invention are characterized by an increased run length and can be used as a printing plate immediately after exposure.

17 Claims, No Drawings

PROCESSLESS LITHOGRAPHIC PRINTING PLATE

This application claims the benefit of U.S. Provisional Patent Application No. 60/257,111, filed Dec. 21, 2000, which is incorporated by reference.

FIELD OF THE INVENTION

The present invention relates to a negative-working heat-sensitive material which is suitable for making a lithographic printing plate by direct-to-plate recording and to a method for imaging said heat-mode recording material by means of an infrared laser.

BACKGROUND OF THE INVENTION

Lithographic printing is the process of printing from specially prepared surfaces, which contain a lithographic image consisting of areas that are capable of accepting ink (oleophilic areas) and areas that do not accept ink but are water-accepting (hydrophilic areas). In so-called wet lithographic printing methods, both water or an aqueous dampening liquid (also called fountain solution) and ink are applied to the plate surface that contains the hydrophilic and oleophilic areas. The hydrophilic areas are soaked with water or the dampening liquid and are thereby rendered oleophobic.

Various heat-mode plate materials are known which can be used as a lithographic master for printing with greasy inks. Ablative plates are the best known examples of so-called processless plates, i.e. plates which do not require any processing and therefore can be used as a printing plate immediately after exposure. The heat, which is generated in the recording layer of such ablative plates by light absorption of a laser beam, removes a hydrophilic or oleophilic topcoat to expose an underlying oleophilic respectively hydrophilic surface, thereby obtaining the necessary differentiation of ink-acceptance between the image (printing) and non-image or background (non-printing) areas.

For example DE-A-2 448 325 discloses a laser heat-mode 'direct negative' printing plate comprising e.g. a polyester film support provided with a hydrophilic surface layer. The disclosed heat-mode recording material is imaged using an Argon laser thereby rendering the exposed areas oleophilic. An offset printing plate is thus obtained which can be used on an printing press without further processing. The plate is called a 'direct negative' plate because it is suitable for direct exposure by a laser beam ("computer-to-plate", no film mask required) and because the areas of the recording material that have been exposed to the laser are rendered ink-accepting and define the image areas, i.e. the printing areas.

Other disclosures in DE-A-2 448 325 concern "direct negative" printing plates comprising e.g. hydrophilic aluminum support coated with a water soluble laser light (Argon-488 nm) absorbing dye or with a coating based on a mixture of hydrophilic polymer and laser light absorbing dye (Argon-488 nm). Further examples about heat-mode recording materials for preparing "direct negative" printing plates have been described in e.g. DE-A-2 607 207, DD-A-213 530, DD-A-217 645 and DD-A-217 914. These documents disclose heat-mode recording materials that contain an anodized aluminum support and a hydrophilic recording layer provided thereon. Laser exposure renders the exposed areas insoluble and ink-receptive, whereas the non-exposed areas remain hydrophilic and water-soluble. Such plates can also be used directly on the press without processing, because the non-exposed areas are removed by the dampening liquid during printing, thereby revealing the anodized aluminum support.

DD-A-155 407 discloses a processless heat-mode 'direct negative' printing plate where a hydrophilic aluminum oxide layer is rendered oleophilic by direct laser heat-mode imaging.

The above heat-mode 'direct negative' lithographic printing plate are characterized by a low recording speed and/or the obtained plates are of poor quality and durability.

EP-A-580 393 discloses an ablative lithographic printing plate directly imageable by laser discharge, the plate comprising a topmost first layer and a second layer underlying the first layer wherein the first layer is characterized by efficient absorption of infrared radiation and the first and second layer exhibit different affinities for at least one printing liquid.

EP-A-683 728 discloses a heat-mode recording material comprising on a support having an ink receptive surface or being coated with an ink receptive layer a substance capable of converting light into heat and a hardened hydrophilic surface layer having a thickness not more than 3 $\mu$m.

U.S. Pat. No. 4,034,183 describes a processless lithographic plate that comprises a light-absorbing hydrophilic top layer coated on a support which is exposed to a laser beam to convert the absorber from an ink repelling to an ink receiving state. All of the examples and teachings require a high power laser, and the run lengths of the resulting lithographic plates are limited.

U.S. Pat. No. 3,832,948 describes both a printing plate with a hydrophilic layer that may be ablated by strong light from a hydrophobic support and also a printing plate with a hydrophobic layer that may be ablated from a hydrophilic support. However, no examples are given.

U.S. Pat. No. 3,964,389 describes a processless printing plate based on the principle of laser transfer of material. This process is very sensitive to transfer defects and requires an additional donor sheet.

U.S. Pat. No. 4,054,094 describes a process for making a lithographic printing plate by using a laser beam to etch away a thin top coating of polysilicic acid on a polyester base, thereby rendering the exposed areas receptive to ink. No details of run length or print quality are given, but it is expected that an non-crosslinked polymer such as polysilicic acid will wear off rapidly and give a short run length.

U.S. Pat. No. 4,081,572 describes a method for preparing a printing master on a substrate by coating the substrate with a hydrophilic polyamic acid and then image-wise converting the polyamic acid to melanophilic polyimide with heat from a flash lamp or a laser. No details of run length, image quality or ink/water balance are given.

Japanese Kokai No. 55/105560 describes a method of preparation of a lithographic printing plate by laser beam removal of a hydrophilic layer coated on a melanophilic support, in which the hydrophilic layer contains colloidal silica, colloidal alumina, a carboxylic acid, or a salt of a carboxylic acid. The only examples given use colloidal alumina alone, or zinc acetate alone, with no crosslinkers or addenda. No details are given for the ink/water balance or limiting run length.

WO 92/09934 describes and broadly claims any photosensitive composition containing a photo acid generator, and a polymer with acid labile tetrahydropyranyl groups. This would include a hydrophobic/hydrophilic switching lithographic plate composition. However, such a polymeric switch is known to give weak differentiation between hydrophilic and oleophilic areas.

All the examples mentioned in the prior art fail to prepare a processless direct imageable printing plate which has a high sensitivity, good start-up behaviour and offers a high run length.

Unpublished EP-A no. 99202109, filed on Jun. 06, 1999, discloses a negative-working heat-sensitive material for making lithographic plates comprising in the order given a lithographic base having a hydrophilic surface, an oleophilic imaging layer and a cross-linked hydrophilic upper layer. The heat generated during exposure in the light-sensitive layer removes the hydrophilic upper layer by ablation. The oleophilic imaging layer has a thin coating thickness that is optimized for achieving a high run length. However when using such thin oleophilic layers, it was found that the run length of the image areas was still not satisfying, because of the effect of the hydrophilic support just below the thin oleophilic layer. This is especially the case when using long pixel dwell times as those for example on external drum laser recording equipment such as the Creo TrendSetter 3244 (drum rotating at 50 to 250 rpm)

SUMMARY OF THE INVENTION

It is an object of the present invention to provide a processless material that is suitable for heat-mode direct-to-plate recording and is characterized by a high sensitivity and a high lithographic quality, especially with regard to run length. It is also an object to provide a material that achieves the high run length when exposed in external drum (long pixel dwell time, low laser beam intensity) as well as internal drum laser recorders (short pixel dwell time, high laser beam intensity). These objects are realized by the material defined in claim 1. Preferred embodiments thereof are defined in the dependent claims.

DETAILED DESCRIPTION OF THE INVENTION

The lithographic printing plate of the present invention comprises in the order given a lithographic base having a hydrophilic surface, an oleophilic imaging layer and a cross-linked hydrophilic upper layer. It has surprisingly been found that by the addition of even very small amounts of transition metal complexes of an organic acid in the oleophilic imaging layer, the run length of these plate increases substantially. Transition metals are generally defined as the elements of atomic numbers 21–31, 39–49 and 71–81. Chromium is highly preferred. Examples of these chromium complexes of organic acids are sold under the QUILON trade name by Dupont Corporation, such as QUILON C, a 25 to 30% by weight solution of the Werner complex of trivalent chromium and myristic or stearic acid in isopropyl alcohol, as described in Quilon chrome Complexes, Dupont Corporation, April, 1992.

The oleophilic imaging layer comprises a binder and a compound capable of converting light into heat.

Suitable compounds capable of converting light into heat are preferably infrared absorbing components having an absorption in the wavelength range of the light source used for image-wise exposure. Particularly useful compounds are for example dyes and in particular infrared dyes as disclosed in EP-A-908 307 and pigments and in particular infrared pigments such as carbon black, metal carbides, borides, nitrides, carbonitrides, and bronze-structured oxides. It is also possible to use conductive polymer dispersion such as polypyrrole, polyaniline, or polythiophene-based conductive polymer dispersions. Carbon black or graphite yield very good and favorable results.

The binder of the oleophilic imaging layer is preferably selected from the group consisting of polyvinyl chloride, polyesters, polyurethanes, novolac, polyvinyl carbazole, or copolymers or mixtures thereof. In a most preferred embodiment, the binder itself is heat-sensitive: e.g. a self-oxidizing polymer containing nitrate ester groups such as cellulose nitrate as disclosed in GB-P-1 316 398 and DE-A-2 512 038; a polymer containing carbonate groups such as polyalkylene carbonate; or a polymer containing covalently bound chlorine such as polyvinylidene chloride. Also substances containing azo or azide groups, capable of liberating $N_2$ upon heating are favorably used.

The dry coating weight of the oleophilic imaging layer is preferably between 0.10 and 0.75 g/m$^2$, more preferably between 0.15 and 0.50 g/m$^2$.

The cross-linked hydrophilic upper layer is preferably coated from aqueous compositions containing hydrophilic binders having free reactive groups including e.g. hydroxyl, carboxyl, hydroxyethyl, hydroxypropyl, amino, aminoethyl, aminopropyl, carboxymethyl, etc., along with suitable crosslinking or modifying agents including e.g. hydrophilic organotitanium reagents, aluminoformyl acetate, dimethylol urea, melamines, aldehydes, hydrolyzed tetraalkyl orthosilicate, etc. Suitable hydrophilic binders for use in the upper layer may be selected from the group consisting of gum arabic, casein, gelatin, starch derivatives, carboxymethyl cellulose and the salts thereof, cellulose acetate, sodium alginate, vinyl acetate-maleic acid copolymers, styrene-maleic acid copolymers, polyacrylic acids and salts thereof, polymethacrylic acids and salts thereof, hydroxyethylene polymers, polyethylene glycols, hydroxypropylene polymers, polyvinyl alcohols and hydrolyzed polyvinylacetate having a hydrolyzation degree of at least 60% by weight and more preferably at least 80% by weight.

Hydrophilic layers containing polyvinylalcohol or polyvinylacetate hydrolyzed to an extent of at least 60% by weight hardened with a tetraalkyl orthosilicate, e.g. tetraethyl orthosilicate or tetramethyl orthosilicate, as disclosed in e.g. U.S. Pat. No. 3,476,937, are particularly preferred because their use in the present heat-mode recording material results in excellent lithographic printing properties.

A further suitable cross-linked hydrophilic layer is disclosed in EP-A-514 990. The layer disclosed in this EP-application comprises the hardening reaction product of a (co)polymer containing amine or amide functions having at least one free hydrogen (e.g. amino modified dextrane) and aldehyde.

The cross-linked hydrophilic upper layer preferably also contains substances that increase the mechanical strength and the porosity of the layer e.g. metal oxide colloid particles which are particles of titanium dioxide or other metal oxides. Incorporation of these particles gives the surface of the cross-linked hydrophilic layer a uniform rough texture consisting of microscopic hills and valleys. These particles are preferably oxides or hydroxides of beryllium, magnesium, aluminum, silicon, gadolinium, germanium, arsenic, indium, tin, antimony, tellurium, lead, bismuth or a transition metal. Particularly preferable colloid particles are oxides or hydroxides of aluminum, silicon, zirconium and titanium, used in 20 to 95% by weight of the hydrophilic layer, more preferably in 30 to 90% by weight of the hydrophilic layer.

The cross-linked hydrophilic upper layer is preferably coated at a dry thickness of 0.3 to 5 $\mu$m, more preferably at a dry thickness of 0.5 to 3 $\mu$m.

The cross-linked hydrophilic upper layer may further comprise additional substances such as e.g. plasticizers, pigments, dyes etc. The cross-linked hydrophilic upper layer may also contain an IR-absorbing compound in order to increase the IR-sensitivity. Particular examples of suitable cross-linked hydrophilic layers for use in accordance with the present invention are disclosed in EP-A-601 240, GB-P-1 419 512, FR-P-2 300 354, U.S. Pat. No. 3,971,660, and U.S. Pat. No. 4,284,705.

According to the present invention, the lithographic base may be an anodized aluminum support. A particularly preferred lithographic base is an electrochemically grained and anodized aluminum support. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulphonic acid, polyvinylbenzenesulphonic acid, sulphuric acid esters of polyvinyl alcohol, and acetals of polyvinyl alcohols formed by reaction with a sulphonated aliphatic aldehyde It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another mode in connection with the present invention, the lithographic base can also be a flexible support, which is provided with a hydrophilic layer, hereinafter called 'base layer'. The flexible support is e.g. paper, plastic film or aluminum. The base layer is preferably a cross-linked hydrophilic layer obtained from a hydrophilic binder cross-linked with a hardening agent such as formaldehyde, glyoxal, polyisocyanate or a hydrolysed tetra-alkylorthosilicate. The latter is particularly preferred.

The hydrophilic binder for use in the base layer is e.g. a hydrophilic (co)polymer such as homopolymers and copolymers of vinyl alcohol, acrylamide, methylol acrylamide, methylol methacrylamide, acrylate acid, methacrylate acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight.

The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

The hydrophilic base layer may also contain substances that increase the mechanical strength and the porosity of the layer. For this purpose colloidal silica may be used. The colloidal silica employed may be in the form of any commercially available water dispersion of colloidal silica for example having an average particle size up to 40 nm, e.g. 20 nm. In addition inert particles of larger size than the colloidal silica may be added e.g. silica prepared according to Stöbber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the hydrophilic base layer is given a uniform rough texture consisting of microscopic hills and valleys, which serve as storage places for water in background areas.

The thickness of the hydrophilic base layer may vary in the range of 0.2 to 25 $\mu$m and is preferably 1 to 10 $\mu$m.

Particular examples of suitable hydrophilic base layers for use in accordance with the present invention are disclosed in EP-A-601 240, GB-P-1 419 512, FR-P-2 300 354, U.S. Pat. No. 3,971,660, and U.S. Pat. No. 4,284,705.

As flexible support of a lithographic base in connection with the present embodiment it is particularly preferred to use a plastic film e.g. polyethylene terephthalate film, polyethylene naphthalate film, cellulose acetate film, polystyrene film, polycarbonate film, etc. The plastic film support may be opaque or transparent.

It is particularly preferred to use a film support to which an adhesion improving layer, also called substrate layer, has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 $m^2$ per gram, more preferably at least 500 $m^2$ per gram.

Optionally the heat-sensitive imaging material can be covered with an additional hydrophilic layer, provided on top of the hydrophilic upper layer discussed above, which comprises an organic compound containing cationic groups as described in EP-A no. 99202110, filed on Jun. 29, 1999.

In accordance with the method of the present invention, the imaging material is image-wise exposed to cause removal of the cross-linked hydrophilic upper layer and whereby the exposed areas are converted to oleophilic areas while the unexposed areas remain hydrophilic. This is mostly the case when using short pixel dwell times (for example 1 to 100 ns). However when using longer pixel dwell times (for example 1 to 20 $\mu$s) the hydrophilic layer may not completely be removed upon exposure. The remaining parts of the hydrophilic layer can then be removed on the press by contact with fountain solution and ink or by an additional wet or dry processing step between the IR-laser exposure and the start-up of the printing process. A suitable dry processing step is e.g. mechanical treatment such as rubbing or brushing the layer with e.g. a cotton path. A preferred additional wet processing step is a gumming step as is commonly used for conventional plates. A gumming step is normally not regarded as a processing step, but rather as a treatment which protects the hydrophilic areas from fingerprints or other contamination which may affect the water-acceptance of these areas. Upon gumming the remaining ablation dust on the plate is removed thereby avoiding contamination of the press. At the same time the hydrophilic areas are covered with a thin layer of the gumming solution inducing a better start-up performance.

Image-wise exposure in connection with the present invention is preferably an image-wise scanning exposure involving the use of a laser or L.E.D. Preferably lasers are used that operate in the infrared or near-infrared, i.e. wavelength range of 700–1500 nm. Most preferred are laser diodes emitting in the near-infrared with an intensity higher than 0.1 mW/$\mu$m$^2$.

According to the present invention the plate is then ready for printing without an additional development and can be mounted on the printing press.

According to a further method, the imaging material is first mounted on the printing cylinder of the printing press and then image-wise exposed directly on the press by means of an integrated image recording device. Subsequent to exposure, the imaging material is ready for printing.

The printing plate of the present invention can also be used in the printing process as a seamless sleeve printing plate. In this option the printing plate may be soldered in a cylindrical form by means of a laser. Such cylindrical printing plate which has as diameter the diameter of the print cylinder can be slid on the print cylinder instead of mounting a conventional printing plate. More details on sleeves are given in "Grafisch Nieuws", 15, 1995, page 4 to 6.

The following example illustrates the present invention without limiting it thereto. All parts and percentages are by weight unless otherwise specified.

EXAMPLES

Example 1 (Comparative)

Preparation of the Lithographic Base

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 $A/m^2$ to form a surface topography with an average center-line roughness Ra of 0.5 μm.

After rinsing with demineralized water the aluminum foil was etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulfuric acid at a temperature of 45° C., a voltage of about 10 V and a current density of 150 $A/m^2$ for about 300 seconds to form an anodic oxidation film of 3.00 $g/m^2$ of $Al_2O_3$, then washed with demineralized water, post-treated with a solution containing polyvinylphosphonic acid and a solution containing aluminum trichloride, and subsequently rinsed with demineralized water at 20° C. during 120 seconds and dried.

Preparation of the Oleophilic Imaging Layer

The light-sensitive layer was coated on the lithographic base at a wet coating thickness of 20 μm from a solution having the following composition:

52.00 g Carbon black dispersion of the following composition:
- 6.50 g Special Schwarz (trade mark from Degussa)
- 0.65 g Nitrocellulose E950 (trade mark from Wolf Walsrode)
- 0.78 g Dispersing agent
- 44.07 g Methyl ethyl ketone 15.70 g Nitrocellulose solution of the following composition
- 1.57 g Nitrocellulose E950 (trade mark from Wolf Walsrode)
- 14.13 g Ethylacetate 2.12 g Cymel solution of the following composition
- 0.42 g Cymel 301 (trade mark from Dyno Cytec)
- 1.70 g Ethylacetate 0.76 g p-toluene sulphonic acid solution of the following composition
- 0.076 g p-toluene sulphonic acid (ptsa)
- 0.684 g Ethylacetate 291.05 g Ethylacetate 205.04 g Buthylacetate Preparation of the Cross-Linked Hydrophilic Upper Layer After drying the light-sensitive layer, the hydrophilic layer was coated to a wet coating thickness of 20 um from a solution having the following composition 70.0 g 6.25% $TiO_2$-dispersion in water, stabilized with Polyviol Wx 48™ (polyvinyl alcohol from Wacker); the dispersion contained 10% polyvinyl alcohol versus $TiO_2$ (average particle size 0.3 to 0.5 μm)

30.0 g 6.25% hydrolyzed tetramethyl orthosilicate in water/ethanol 90:10.

1.2 g 5% wetting agent in water

The pH of this solution was adjusted to 4 prior to coating. After coating, the layer was hardened for 12 hours at 67° C./50% R.H.

Examples 2–6 (Invention)

The materials 2–6 were prepared in an identical way as the comparative material described above with the only difference that in the solution of the oleophilic layer a part of the Nitrocellulose solution was replaced by a Quilon C solution (5% of the commercially available solution in Ethylacetate/isopropanol 1:1; trade mark of DuPont Corporation). The details are given in table 1.

The resulting imaging materials were imaged on a Creo Trendsetter 3244T™ at 2400 dpi operating at a scanning speed of 80 rpm and a laser output of 16 Watt. After imaging the plate was mounted on a Sakurai Oliver 52 press using K+E 800 Skinnex as ink and 4% Aqua aid+3% Tame as dampening liquid. A non-compressible blanket was used. Subsequently the press was started by allowing the print cylinder with the imaging material mounted thereon to rotate. The dampener rollers of the press were first dropped on the imaging material so as to supply dampening liquid to the imaging material and after 10 revolutions of the print cylinder, the ink rollers were dropped to supply ink. After 10 further revolutions, the paper supply was started. The run length was determined based on the number of sheets that could be printed without toning and without significant image wear. The results are summarized in table 2. It is clear that the addition of very small amounts of Quilon C i.e. 0.75 $mg/M^2$ causes a significant improvement of the run length.

TABLE 1 coating solutions of the oleophilic imaging layer (amounts in g)

| Example | carbon black dispersion | nitro-nitrocellulose solution | Quilon C solution | cymel solution | ptsa-solution | Ethyl-acetate | Buthyl-acetate |
|---|---|---|---|---|---|---|---|
| 1 | 52 | 15.7 | 0.0 | 2.12 | 0.76 | 291.05 | 205.04 |
| 2 | 52 | 14.7 | 2.0 | 2.12 | 0.76 | 291.00 | 205.04 |
| 3 | 52 | 12.7 | 6.0 | 2.12 | 0.76 | 290.90 | 205.04 |

TABLE 1-continued coating solutions of the oleophilic imaging layer (amounts in g)

| Example | carbon black dispersion | nitro- nitrocellulose solution | Quilon C solution | cymel solution | ptsa- solution | Ethyl- acetate | Buthyl- acetate |
|---|---|---|---|---|---|---|---|
| 4 | 52 | 10.7 | 10.0 | 2.12 | 0.76 | 290.80 | 205.04 |
| 5 | 52 | 5.7 | 20.0 | 2.12 | 0.76 | 290.55 | 205.04 |
| 6 | 52 | 0 | 31.4 | 2.12 | 0.76 | 290.26 | 205.04 |

TABLE 2 results of run length test

| Example | Amount of Quilon C metal complex in oleophilic layer | Run length |
|---|---|---|
| 1 | 0.00 mg/m$^2$ | 2500 |
| 2 | 0.75 mg/m$^2$ | 15000 |
| 3 | 2.25 mg/m$^2$ | ≧20000 |
| 4 | 3.75 mg/m$^2$ | ≧20000 |
| 5 | 7.50 mg/m$^2$ | ≧20000 |
| 6 | 11.75 mg/m$^2$ | ≧20000 |

We claim:

1. A negative-working heat-sensitive material for making a lithographic printing plate by direct-to-plate recording, the material comprising in the order given a lithographic base having a hydrophilic surface, an oleophilic imaging layer and a cross-linked hydrophilic upper layer, wherein the oleophilic imaging layer comprises at least one transition metal complex of an organic acid.

2. A direct-to-plate method of making a lithographic printing plate comprising the steps of (i) providing a material according to claim 1;

(ii) image-wise exposing the material to an infrared laser beam having an intensity higher than 0.1 mW/$\mu$m$^2$;

(iii) contacting the material with fountain solution and ink.

3. A method according to claim 2 wherein, before or after step (ii), the material is mounted on a cylinder of a printing press.

4. A material according to claim 1 wherein the transition metal is chromium.

5. A direct-to-plate method of making a lithographic printing plate the steps of (i) providing a material according to claim 4;

(ii) image-wise exposing the material to an infrared laser beam having an intensity higher than 0.1 mW/$\mu$m$^2$;

(iii) contacting the material with fountain solution and ink.

6. A material according to claim 1 wherein the oleophilic imaging layer has a dry coating weight between 0.1 and 0.75 g/m$^2$.

7. A direct-to-plate method of making a lithographic printing plate comprising the steps of (i) providing a material according to claim 6;

(ii) image-wise exposing the material to an infrared laser beam having an intensity higher than 0.1 mW/$\mu$m$^2$;

(iii) contacting the material with fountain solution and ink.

8. A material according to claim 1 wherein the oleophilic imaging layer comprises a heat-sensitive binder.

9. A direct-to-plate method of making a lithographic printing plate comprising the steps of (i) providing a material according to claim 8;

(ii) image-wise exposing the material to an infrared laser beam having an intensity higher than 0.1 mW/$\mu$m$^2$;

(iii) contacting the material with fountain solution and ink.

10. A material according to claim 1 wherein the oleophilic imaging layer comprises carbon black or graphite as IR-absorbing compound.

11. A direct-to-plate method of making a lithographic printing plate comprising the steps of (i) providing a material according to claim 10;

(ii) image-wise exposing the material to an infrared laser beam having an intensity higher than 0.1 mW/$\mu$m$^2$;

(iii) contacting the material with fountain solution and ink.

12. A material according to claim 1 wherein the cross-linked hydrophilic upper layer comprises oxides or hydroxides of beryllium, magnesium, aluminum, silicon, gadolinium, germanium, arsenic, indium, tin, antimony, tellurium, lead, bismuth, titanium or a transition metal.

13. A direct-to-plate method of making a lithographic printing plate comprising the steps of (i) providing a material according to claim 12;

(ii) image-wise exposing the material to an infrared laser beam having an intensity higher than 0.1 mW/$\mu$m$^2$;

(iii) contacting the material with fountain solution and ink.

14. A material according to claim 1 wherein the lithographic base is a grained and anodized aluminum support or a flexible support provided with a cross-linked hydrophilic base layer.

15. A direct-to-plate method of making a lithographic printing plate comprising the steps of (i) providing a material according to claim 14;

(ii) image-wise exposing the material to an infrared laser beam having an intensity higher than 0.1 mW/$\mu$m$^2$;

(iii) contacting the material with fountain solution and ink.

16. A material according to claim 1 wherein the cross-linked hydrophilic upper layer has a dry thickness between 0.3 and 5 $\mu$m.

17. A direct-to-plate method of making a lithographic printing plate comprising the steps of (i) providing a material according to claim 16;

(ii) image-wise exposing the material to an infrared laser beam having an intensity higher than 0.1 mW/$\mu$m$^2$;

(iii) contacting the material with fountain solution and ink.

* * * * *